(12) United States Patent
Johansson et al.

(10) Patent No.: US 6,711,024 B1
(45) Date of Patent: Mar. 23, 2004

(54) FLEXIBLE MICROSYSTEM AND BUILDING TECHNIQUES

(75) Inventors: Stefan Johansson, Uppsala (SE); Staffan Karlsson, Uppsala (SE)

(73) Assignee: Piezomotors Uppsala AB, Uppsala (SE)

( * ) Notice: Subject to any disclaimer, the term of this patent is extended or adjusted under 35 U.S.C. 154(b) by 0 days.

(21) Appl. No.: 09/889,734

(22) PCT Filed: Jan. 14, 2000

(86) PCT No.: PCT/SE00/00063
§ 371 (c)(1),
(2), (4) Date: Jul. 20, 2001

(87) PCT Pub. No.: WO00/44208
PCT Pub. Date: Jul. 27, 2000

(30) Foreign Application Priority Data

Jan. 20, 1999 (SE) .................................. 9900164

(51) Int. Cl.⁷ .......................... H05K 7/02; H05K 7/06; H05K 7/08; H05K 7/10
(52) U.S. Cl. ........................................ 361/760; 361/761
(58) Field of Search .................................. 361/748, 749, 361/760–761; 174/254, 260, 52.1–52.4; 429/99–100; 379/357.03; 310/334–337

(56) References Cited

U.S. PATENT DOCUMENTS

| | | | |
|---|---|---|---|
| 4,394,707 A | | 7/1983 | Consoli |
| 4,810,917 A | | 3/1989 | Kumar et al. |
| 4,995,077 A | * | 2/1991 | Malinowski ........... 379/357.03 |
| 5,103,375 A | | 4/1992 | Cottingham et al. |
| 5,170,326 A | * | 12/1992 | Meny et al. ................. 174/254 |
| 5,220,488 A | | 6/1993 | Denes |
| 5,377,263 A | * | 12/1994 | Bazemore et al. ..... 379/357.03 |
| 5,406,027 A | * | 4/1995 | Matsumoto et al. ......... 174/260 |
| 5,607,793 A | * | 3/1997 | Alexandres et al. ........ 429/100 |
| 5,644,230 A | * | 7/1997 | Pant et al. ................... 324/247 |
| 6,118,072 A | * | 9/2000 | Scott ........................... 174/254 |

OTHER PUBLICATIONS

A. Gotz et al., "Packaging of Pressure Sensor Chips for Microsystem Applications: Technology and Test," Proceedings of the Ninth Micromechanics Europe Workshop, MME '98, Jun. 3–5, 1998, Ulvik in Hardanger, Norway, pp. 272–275.

Product Information about SA30 Crash Sensor from Senso-Nor a.s, Norway.

* cited by examiner

Primary Examiner—John B. Vigushin
Assistant Examiner—Tuan Dinh
(74) Attorney, Agent, or Firm—Young & Thompson

(57) ABSTRACT

A flexible printed circuit board, supports electronics components, wiring, mechanical and components of an electromechanical transducer also acts as a main structural member for the entire microsystem.

27 Claims, 6 Drawing Sheets

FLEXIBLE MICROSYSTEM AND BUILDING TECHNIQUES

TECHNICAL FIELD

The present invention generally relates to transducer microsystems and assembling methods therefore, and in particular to transducer microsystems comprising electromechanical transducer components built in a flexible manner.

BACKGROUND

Microsystems are in the following regarding systems of components with sizes in the order of centimeters or less. Transducers are components or devices that transduces one energy form to another. Normally the transducers are divided in actuators and sensors even though there are many that can operate both as sensors and actuators. A sensor transforms an external stimulus to another useful energy form, preferably an electrical signal. An actuator essentially makes the opposite. A signal, preferably electrical, is transformed into any other useful energy form. Among the useful energy forms or external stimuli can be included mechanical, acoustic, electrostatic, electromagnetic, magnetic, optical, thermal, biological, biomedical, medical, chemical and atomic force energy. An electromechanical transducer is thus an actuator, transforming an electrical signal into a mechanical motion, and/or a sensor, transforming a mechanical motion into an electrical signal. Depending on application, the energy forms can be further subdivided e.g. mechanical transducers are typically divided into subgroups such as piezoelectric, electrostrictive, shape memory, inertial and resonant effects.

Examples of transducer microsystems are e.g. piezoelectric micromotors, ink jet print heads, accelerometers and pressure sensors packaged with their integrated circuits. A transducer microsystem normally consists of a number of microcomponents, such as e.g. electronic components, micromechanical components, electromechanical components, electrical leads, connectors, structural members etc. The production of a microsystem thus normally involves the assembling of a number of parts, most of which are very small. Monolithic microcomponents are normally assembled in a package and thereafter assembled in one or many levels of carriers. Assembling, mechanically and electrically, of tiny parts is a technically complicated matter, in particular when time, and thereby production costs, and space are limited. One common drawback from a commercial point of view is thus that the assembling techniques of the systems become the main technical obstacle.

A large number of Microsystems are available today, and the general development tendency is to further reduce the sizes. The above assembling problems thus becomes even more accentuated, since members serving to connect different parts increases the total size of the system. One way to reduce these problems are expressed in the wish to reduce the total number of components and integrate as many functions as possible in each component. However, a final assembling procedure will always remain.

A transducer microsystem according to prior art normally comprises a number of transducer components attached to some main structural element. A typical example is e.g. the crash sensor SA30, manufactured by SensoNor a.s, Norway. Another example may e.g. be found in "Packaging of Pressure Sensor Chips for Microsystem Applications: Technology and Test", by A. Götz, C. Cané, A. Morrissey and J. Alderman, Proceedings of "The ninth Micromechanics Europe Workshop, NME'98", p. 272–275. In order to function, the transducer components normally have to be pressed or supported against internal or external forces in the system. The carrier and/or the package functions as the main structural member in the system. In the case of e.g. an electromechanical motor, an internal pressing force has to exist. The pressing force gives rise to a frictional force, by which the movable part may be moved.

The main structural element thus serves several purposes. The main structural member should keep the components in position, relative to some reference points. The main structural member should also support the components against external forces, protect the components against mechanical damage and serve as a general casing. The main structural member also often provide an attachment member for the whole system to be connected mechanically to other systems, i.e. a mechanical connection point or points. For Microsystems, the main structural member normally also supply internal forces between different parts of the system, as described above. The transducer microsystem further comprises electrical connectors, wires and electronics, supporting the transducer components.

A general problem with microsystems according to prior art is that the assembling is time consuming, technically difficult and increases the total system size. Microsystems according to prior art also exhibit problems regarding tolerances, assembling precision and adjustment possibilities.

SUMMARY OF THE INVENTION

An object of the present invention is thus to reduce the number of components necessary for assembling a transducer microsystem. A further object of the present invention is to provide a more efficient and flexible assembling method, which at the same time allows for high precision.

The above objects are provided by a device and a method according to the enclosed claims. In general words, the present invention makes use of a flexible printed circuit board, not only as a mounting support for electronics components and wiring, but also for mechanically supporting various components as well as acting as a main structural member for the entire microsystem. All components necessary for a microsystem may be mechanically mounted onto a flexible printed circuit board, which finally is elastically deformed to a required final shape. In the final shape, the resilience of the flexible printed circuit board is used to apply elastic forces on selected transducer components of the microsystem.

In preferred embodiments, the flexible printed circuit board is provided with geometrical structures, which are possible to use for locking and/or adjustment of the final deformation of the flexible printed circuit board. The mechanical attachment of the components for the microsystem to a flexible printed circuit board takes preferably place with the flexible printed circuit board in a substantially two-dimensional state, whereby a final shape of the microsystem is achieved by deforming the flexible printed circuit board.

BRIEF DESCRIPTION OF THE DRAWINGS

The invention, together with further objects and advantages thereof, may best be understood by making reference to the following description taken together with the accompanying drawings, in which.

DETAILED DESCRIPTION

Figure 1A:
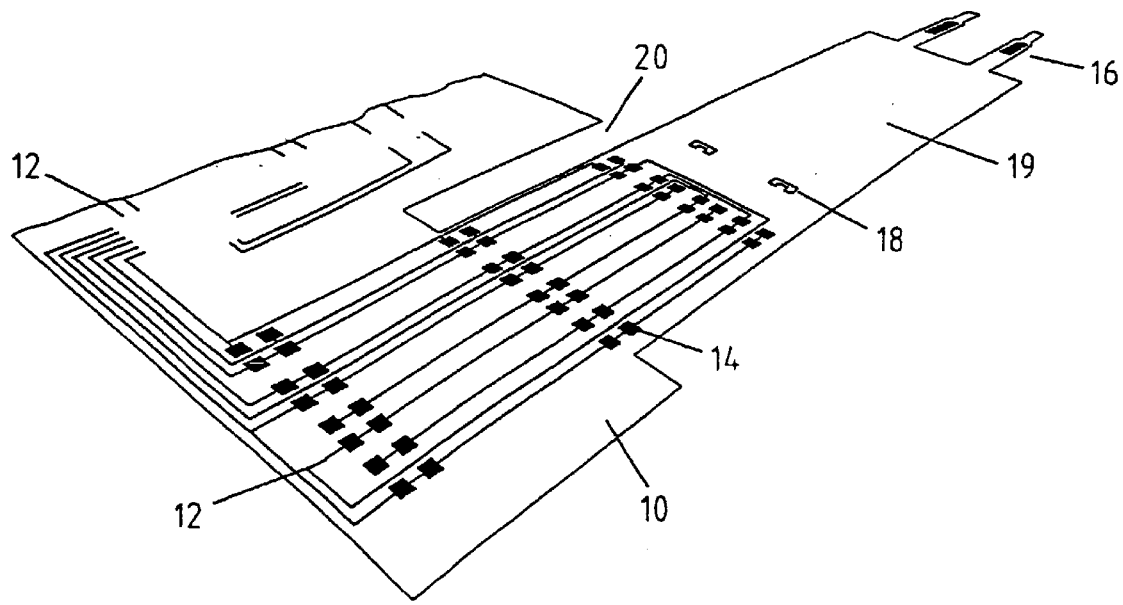
FIG. 1a is a schematic view of a flexible printed circuit board without any components mounted.

In traditional transducer Microsystems, a main structural member is one or several parts that as described above is used as e.g. a casing, box or for other supporting tasks. Transducer Microsystems are systems comprising components which convert an electrical energy to another form, or the opposite, as described earlier, and with sizes in the order of centimeters or less. When the size of a microsystem is reduced, the influence of the mass of the components decreases with the cube of a length measure, while the area which takes up the force only decreases with the square of a length measure. In practice, this can be expressed as when the size is decreased, the inertial forces becomes less and less important and for systems of the size of centimeters or less, the inertial forces can be more or less neglected.

When the size of a system decreases, the rigidness of any main structural member may be decreased. For Microsystems, which traditionally anyway are assembled on rigid structures, elastic constructions would be possible to use. Sheets of elastic materials may either by itself, or in a folded or deformed manner, be enough stable to constitute a main structural member.

The monolithic components of a transducer microsystem are normally assembled in a package and thereafter assembled in one or many levels of carriers. The size scale of the Microsystems makes it less important with packaging from a mechanical point of view and the whole assembling and building techniques for the system can be greatly simplified if such parts may be omitted. In the present invention, a flexible printed circuit board constitutes the main structural member of the microsystem. Here, the tasks for a main structural member follows the description in the background description, while the composition of the main structural member is completely different. All, or at least most of the components, electromechanical, purely electrical, optical components, actuators, sensors etc, may in this view be assembled directly on one and the same carrier.

Furthermore, on a microscale, foils of elastic materials, such as flexible printed circuit boards, can be considered to be rather stiff in relation to the typical loads it should carry. However, in a macroscale, i.e. considering a whole microsystem, the foil can still be considered to be easily deformable, and do also provide a useful resilient behaviour. By reshaping portions or the whole flexible printed circuit board, final structural shaped may easily be obtained, which at the same time may be used for providing forces onto some transducer components. Transducer Microsystems operating to move different members, normally uses different types of forces, mostly frictional forces, between the contact points of a drive unit and the drive member to achieve the motion. Means for creating such normal forces between different components have to be supplied. In a device according to the present invention, the flexible printed circuit board may also be used to accomplish these normal forces.

In the beginning of this detailed description, an example of a microsystem is described, to illustrate the advantages with the present invention. In this example, the microsystem is a microelectromechanical motor, consisting of three monolithic piezoelectric pieces of driving units, between which a shaft is held. The piezoelectric driving units are to be mounted with a normal force against the shaft in order to accomplish a movement of the shaft. This movement can either be rotational or a translation. One suitable approach is to use the principles disclosed in the international patent application WO-97/36366. However, the details of the motor operation is not of significant importance for the assembling principles of the present invention, and many other types of drive mechanisms, such as resonant or stick-slip mechanisms, and other micromotors may be assembled in a similar way.

FIG. 1a illustrates a flexible printed circuit board 10, on which electrical leads 12 and contact pads 14 are provided in a conventional manner. Any standard techniques used for normal flexible printed circuit boards 10 are possible to use. In the flexible printed circuit board 10 in FIG. 1a, additional structures are also present. A slit 20 is cut a distance in the flexible printed circuit board 10 from one edge. This slit 20 thus defines a tab member 19 of the flexible printed circuit board 10. In the tab member 19 of the flexible printed circuit board 10, two strips 16 with a set of rectangular openings are provided in one end, and close to the centre of the tab member 19, two mainly U-formed slit structures 18 are provided. The tab portion defined by the U-formed slit structure 18 has substantially the same width as the length of the rectangular openings in the strips 16. The geometrical structures 16, 18 and 20 may be provided in different ways, according to the knowledge of anyone skilled in the art, e.g. by using laser ablation, mechanical machining or lithografical methods, such as plasma etching.

Figure 1B:
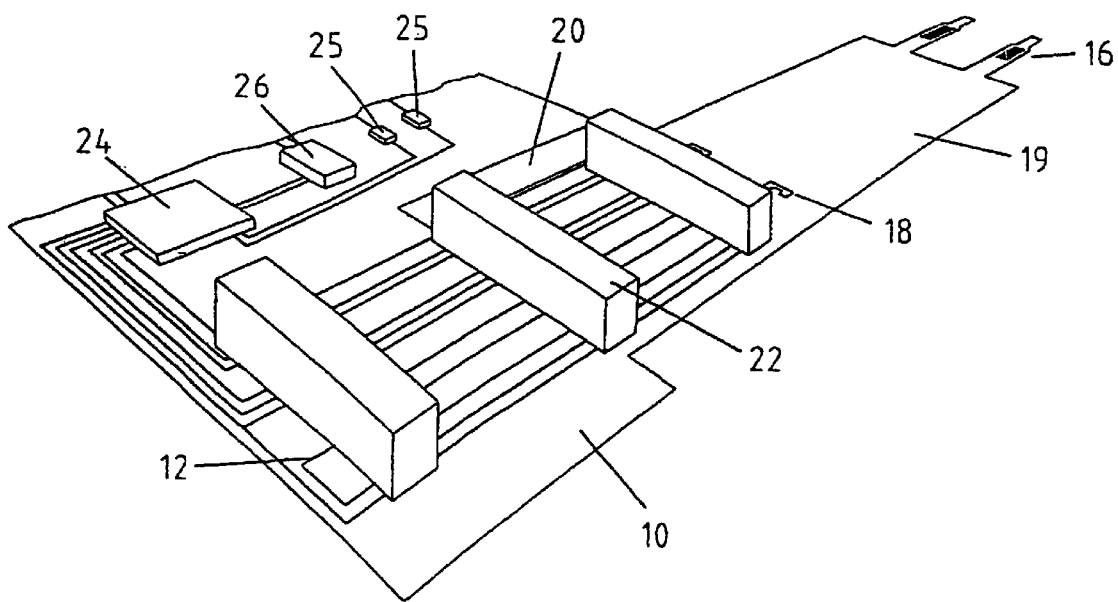
FIG. 1b is a schematic view of a flexible printed circuit board according to the present invention, with mounted components.

FIG. 1b illustrates the same flexible printed circuit board 10 as in FIG. 1a, but with a number of components mounted on its surface. Three monolithic piezoelectric drive units 22 are mounted parallel at regular distances at the tab member 19. A voltage supply unit 24 and a position sensor 26 are mounted at the flexible printed circuit board 10 together with various electronics components 25. The printed leads 12 connect the different components, as is conventional in normal assembling of electronics circuit boards. The step of mounting the components may therefore advantageously be performed in an efficient and cheap manner by conventional techniques.

Figure 1C:
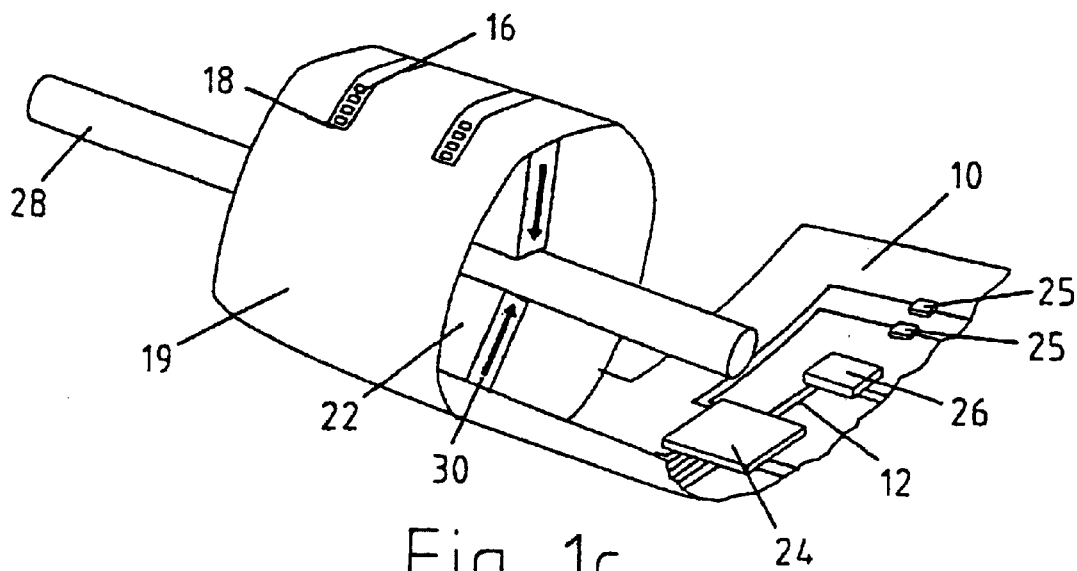
FIG. 1c is a schematic view of a partially deformed flexible printed circuit board according to a preferred embodiment of the present invention.

In FIG. 1c, the tab member 19 has been deformed and bent in a cylindric shape enclosing a shaft 28. The originally upper surfaces of monolithic piezoelectric drive units 22 are brought into mechanical contact with the shaft 28, and the tab member 19 is stretched to apply a force 30 onto the monolithic piezoelectric drive units 22, which force 30 is transferred to the shaft 28 by frictional means. The tab member 19 is locked in a stretched position by means of the strips 16 and the U-formed slit structures 18, by introducing the tabs defined by the U-formed slit structures 18 into the rectangular openings of the strips 16.

The micromotor illustrated in FIG. 1c is a micromotor which is ready for operation. All necessary supply and control electronics may be included on the flexible printed circuit board 10. The sensor 26 may e.g. determine the position or the speed, rotational or translational, of the shaft 28. The advantages with the present assembling method is now obvious. All parts of the system, except for the shaft 28, are mounted onto the flexible printed circuit board 10, while the board 10 is in a flat state. Cheap conventional electronics mounting techniques may be used. A simple deformation of a part of the flexible printed circuit board 10 brings different microelectromechnical parts 22 into their final positions, and the normal force necessary for the actuating operation is supplied by the resilient properties of the flexible printed circuit board 10.

Flexible printed circuit boards 10 may comprise different polymer insulating materials. A preferred material is polyimide, which is a standard material in such applications, and has suitable mechanical properties for a large number of applications. Polyimide exhibits a high yield stress and small creep. Furthermore, it is thermally and chemically stable, and will e.g. withstand temperatures above 300° C. Polyimide is also suitable for many biomedical applications, since it is a biocompatible material.

The contact force 30 illustrated in FIG. 1c gives rise to a mechanical contact. In different microsystem applications, also electrical contact may be requested, and according to the present invention, such electrical contacts may be provided in a similar manner.

Figure 2:
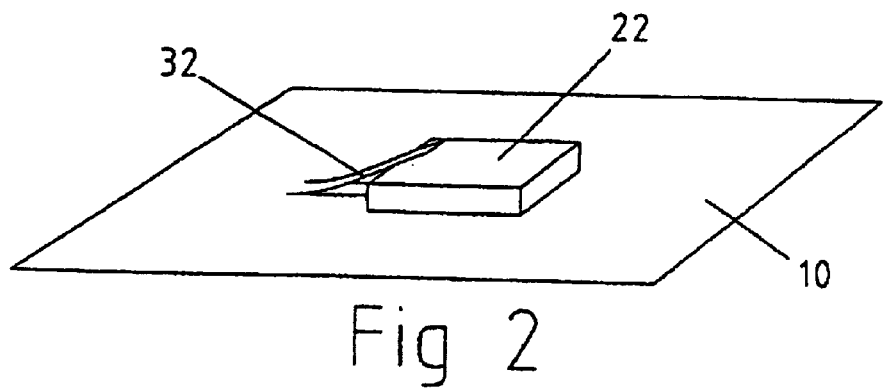
FIG. 2 is a schematic view of a component mounted on a flexible printed circuit board by a spring force.

The actual mounting of the components may also be supported by the flexible printed circuit board 10. In FIG. 2, a narrow tab 32 of the material of the flexible printed circuit board 10 may be cut out and used as a spring. For small items, such as microelectromechanical components 22, the force necessary to fix the components in position is not very large. By using relatively short resilient members 32 of the flexible printed circuit board 10, the elastic spring force may be enough to hold the component in position. If the tab 32 is covered with a conducting layer at the side facing the microelectromechanical component 22, an electrical contact may also be formed.

Figure 3:
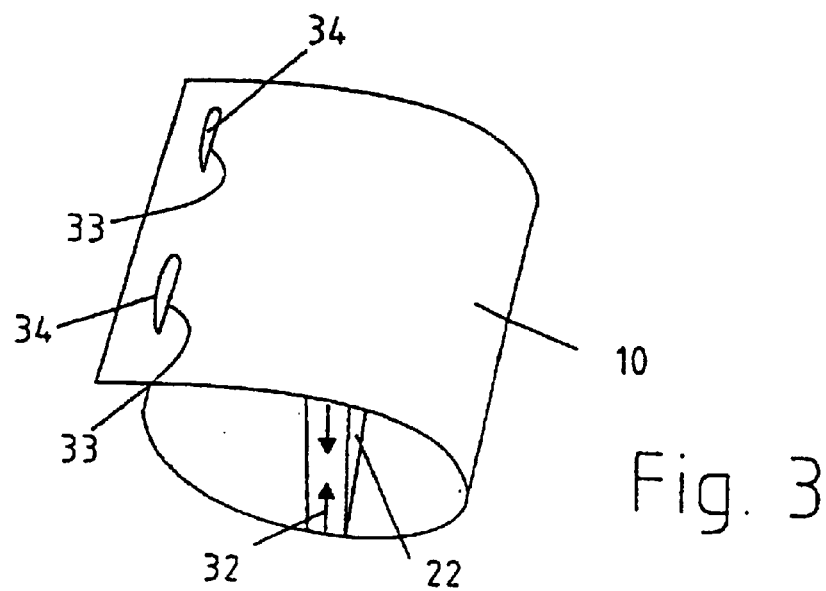
FIG. 3 is a schematic drawing illustrating a deformation of a flexible printed circuit board giving a force application on a transducer component according to the present invention.

FIG. 3 illustrates another possibility to arrange a flexible printed circuit board 10 in order to accomplish a force onto a microelectromechanical component 22. At one end of the flexible printed circuit board 10, geometrical structures are provided, in this case in a semicircular shape 34. The semicircular members 34 can be forced through slits 33, whereby the semicircular members 34 are locked at the opposite side. The slits 33 are preferably weakly C- or S-shaped, whereby the introduction of the semicircular members 34 is made easily by deforming the semicircular members 34 along the slit shape, while after the semicircular members 34 have regained their original shapes at the opposite side of the flexible printed circuit board 10, the semicircular member is caught. If several slits 33 are positioned close to each other, the slit shape may be straight, but the direction twisted as compared with the finally mounted semicircular members 34.

The flexible printed circuit board 10 is deformed in a closed shell shape, which also may act as a casing for the microsystem. The flexible printed circuit board 10 also applies a force onto the microelectromechanical component 22, and this force may be used for achieving a mechanical and/or electrical contact. In both FIG. 2 and FIG. 3, a part of the flexible printed circuit board 10 is elastically deformed, and a microelectromechanical component 22 is positioned in the deformation path, whereby the resilience of the deformed flexible printed circuit board 10 applies a spring force on the microelectromechanical component 22.

Figure 4:
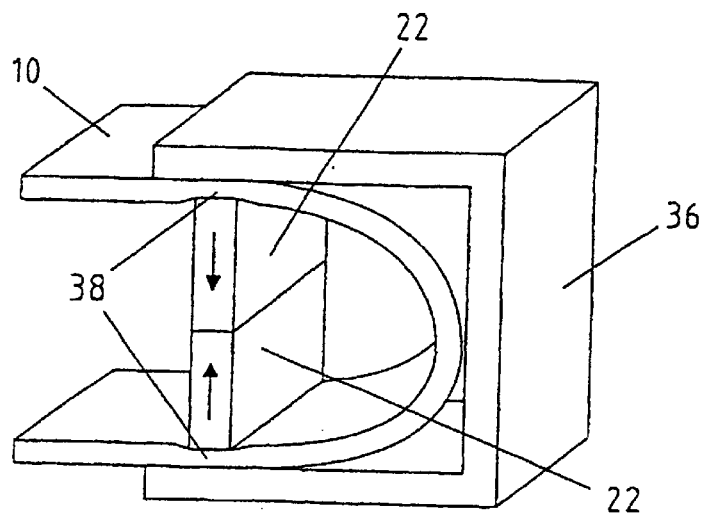
FIG. 4 is a schematic drawing illustrating a local deformation of the thickness of a flexible printed circuit board caused by a rigid support member.

There are several different applications when the contact forces between the drive units and the drive member has to be very high. In that case it is advantageous to use an external support structure that improves the stiffness. FIG. 4 illustrates such a case, where an external rigid member 36 is used as a counteracting means for achieving a strong resilient force. A portion of a flexible printed circuit board 10, on which microelectromechanical component 22 are attached, is deformed and pressed between the jaws of the external rigid member 36. The distance between the jaws is slightly less than the microelectromechanical components 22 and the flexible printed circuit board 10 in an uncompressed state, and the entering of the flexible printed circuit board 10 into the external rigid member 36 causes a part of the flexible printed circuit board 10 to be compressed 38. This compression gives rise to an elastic force by the board material itself, which force may be quite high. The flexible printed circuit board 10 is thus arranged with an elastic deformation 38 substantially perpendicular to its surface, between the microelectromechanical component 22 and the external rigid member 36, whereby the intrinsic material elasticity of the flexible printed circuit board 10 provides the elastic contact force. The deformation may of course also take place e.g. between different microelectromechanical components 22. The external rigid member 36 is in this case only used for produce the force, but may also be combined to constitute a part of the main structural member. Note that the dimensions in FIG. 4 are drawn in a different scale, compared with most other figures.

In some applications it might be important to conduct heat to or from the microsystem and a thermally conducting structure is therefore needed. In these cases, a direct contact between the electric ground plane of the motor and the support improves the thermal transport if the electric conductors in the components to be cooled are highly thermally conductive, e.g. of metals as silver etc. Alternatively, separate cooling flanges may be mounted at the flexible printed circuit board in connection with the heat producing items. Another heat related subject is the heat expansion. Polyimide has a heat expansion coefficient, which is quite different from many other components in a microsystem. Large temperature differences may therefore cause large differences in heat expansion, which eventually may lead to fractures. In order to prohibit such behaviours, the flexible printed circuit board may e.g. be combined with a sheet of another material, the combination of which gives a proper thermal expansion.

In some embodiments one or more parts of the microsystem is manufactured or assembled with dimensional or positioning tolerances that are larger than the motion of e.g. the contact points of drive units. The dimensional tolerances can to a large extent be compensated for by the resilience of the flexible printed circuit board. The same holds true for wear of exposed points, as the resilience of the flexible printed circuit board can be used to continuously compensate for dimensional changes.

In a preferred embodiment, the microsystem is made out of one single piece of flexible printed circuit board and one part of the flexible printed circuit board is folded and locked at another given position in the flexible printed circuit board. This may be accomplished by some type of locking geometries. In FIG. 1c, a simple locking structure closed the structural unit, which then constituted the casing of the actual motor at the same time as it provided the normal forces between drive units and drive members.

Furthermore, if the locking mechanism has a multitude of locking positions, both the contact forces and the size of the casing can be adjusted in a more or less continuous way.

Figure 5A:
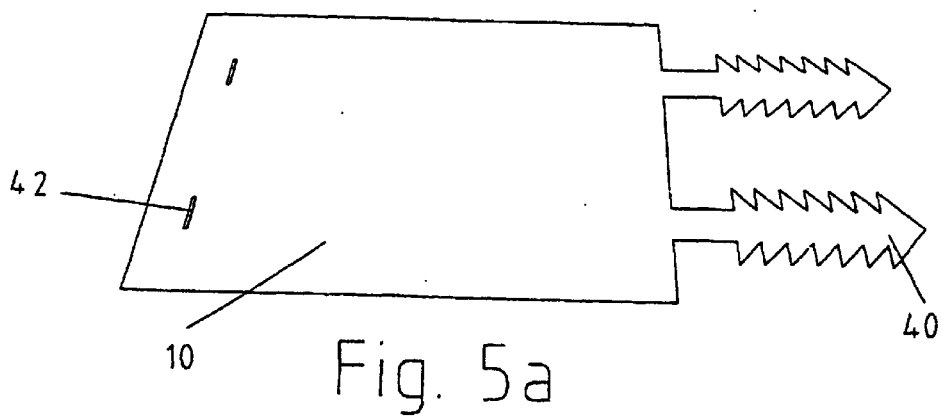
FIG. 5a is a schematic drawing illustrating a flexible printed circuit board having adjustable locking structures in an undeformed state.
Figure 5B:
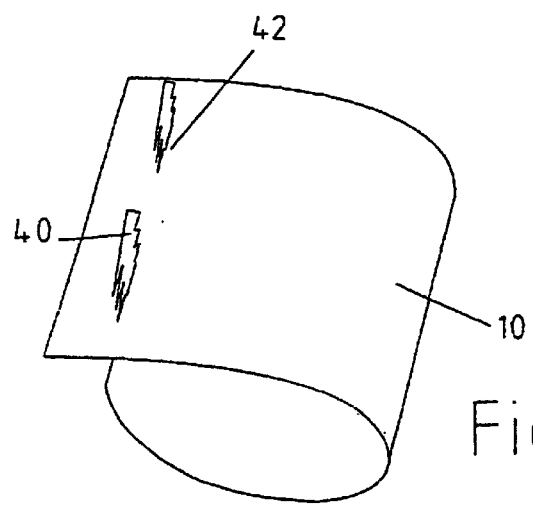
FIG. 5b is a schematic drawing illustrating the flexible printed circuit board of FIG. 5a locked in a deformed state.

FIGS. 5a and 5b illustrate flexible printed circuit boards 10 with geometrical structures comprising locking structures, which provides an adjustable locking. Tabs equipped with arrow-like structures 40 are provided at the flexible printed circuit board 10 and slits 42 are provided at a distant location. By deforming the flexible printed circuit board 10 the arrow-like tabs 40 may be introduced through the slits 42. The slit 42 may be formed in a S- or C-shape, as described above. Since the tabs 40 have different levels of "wings", a suitable and adjustable stretch of the flexible printed circuit board 10 can be achieved.

Figure 6:
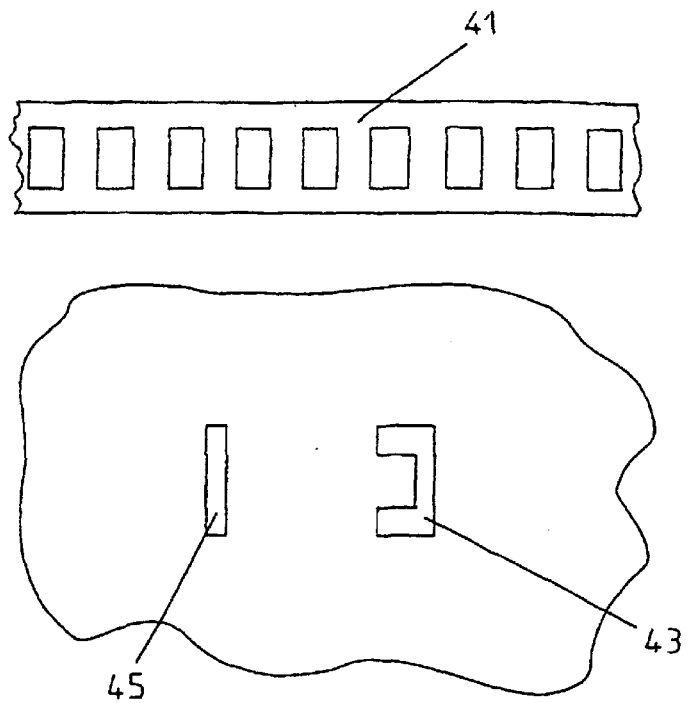
FIG. 6 is a schematic illustration of another adjustable locking structure which is possible to use in the present invention.

FIG. 6 illustrates an alternative adjustable locking mechanism, similar to the locking mechanism used in FIGS. 1a–c. A tab 41 has a general ladder shape, with successive rectangular cut-outs. This part constitutes the "male" part of the locking geometrical structure. As a "female" counterpart, a generally C-shaped slot 43 is cut out in the flexible printed circuit board 10. A straight slit 45 besides the C-shaped slot 43 works as friction increasing means in the locking structures. The ladder-shaped tab 41 is stuck through the straight slit 45 and then back up through the generally C-shaped slot 43, where the centre part of the C-shaped slot 43 engages into the rectangular cut-out in the ladder tab 41. In this manner an adjustable stretch may be accomplished in the flexible printed circuit board 10.

Figure 7A:
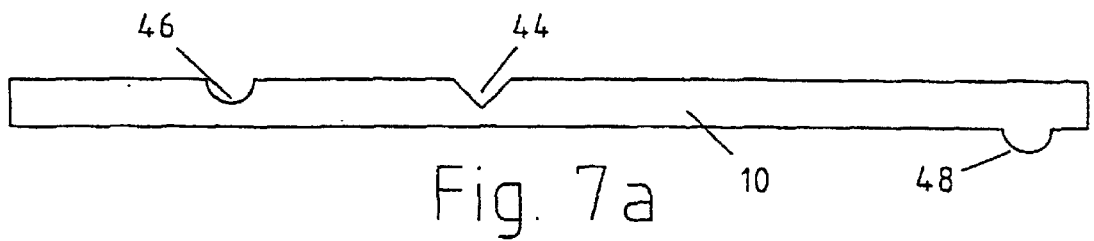
FIG. 7a is a schematic illustration of a flexible printed circuit board having geometrical localising structures in an undeformed state.
Figure 7B:
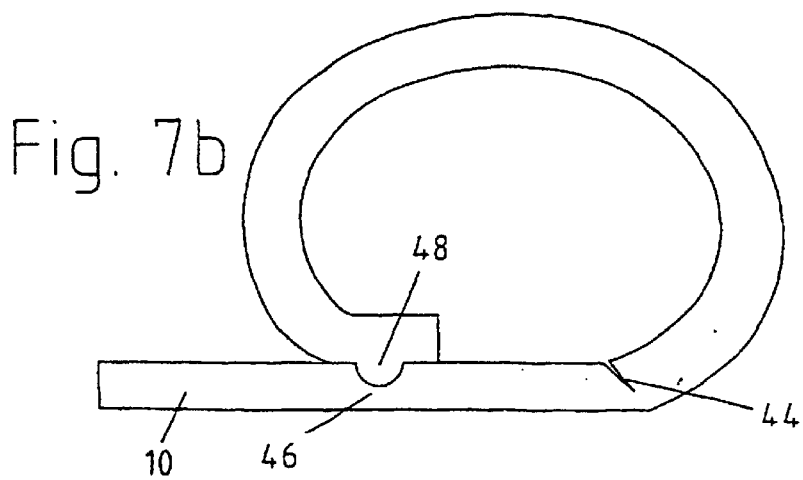
FIG. 7b is a schematic illustration of the flexible printed circuit board of FIG. 7a in a deformed state, where the geometrical structures are brought into engagement.

The flexible printed circuit board 10 may also be used for improving the precision in assembling a microsystem. The basic principles are based on the possibility to easily provide small and accurate geometrical structures in the flexible printed circuit board 10. The principles are illustrated in FIGS. 7a and 7b. A flexible printed circuit board 10 is provided with different geometrical structures. A pit 46, a bump 48 and a groove 44 is in this illustrative example provided at both sides of the flexible printed circuit board 10. FIG. 7a illustrates the flexible printed circuit board 10 in a flat state, while it in FIG. 7b has been bent, with the groove as an indication for the bending position. The bump 48 is brought into engagement with the pit 46, whereby an accurate relative positioning of the two portions of the flexible printed circuit board 10 is possible to achieve.

In this manner, the reshaping, deflection or deformation of the flexible printed circuit board 10 may be performed, providing structures with very accurate geometrical shapes. The geometrical structures in the flexible printed circuit board 10 may be of any shape, e.g. slits, grooves, pits, holes, bumps, ridges, valleys etc. These geometrical shapes may be engaged to another geometrical structure at the same flexible printed circuit board 10, another flexible printed circuit board or other members of the microsystem. The geometrical shapes, such as ridges or other forms of elevated structures and valleys, grooves or other hollowed out structures may be used to strengthen and weaken the flexible printed circuit board 10, and serve as folding indications. Small parallel ridges may also be used as e.g. friction increasing means, either for the operation of any electromechanical component or as a friction assisted locking mechanism.

Folding of material sheets may be performed in many ways, in order to achieve a certain geometrical structure or to make a stiffer carrier. In some cases, locking structures are needed to hold the final structure together, while in other examples, the foldings themselves will be interlocking, and no separate locking structures are needed.

The building technique according to the present invention is flexible in many senses and using our knowledge from the biological world, a number of complex microsystems as e.g. microrobots can be constructed. Common in the insect world is to use shell structures as the main structural member. Flexible joints are used in-between the stiffer shell segments to accomplish motion of various limbs. By folding planar flexible carriers with geometrical slits, grooves etc. similar structures as is used in the biological world can be achieved. The structural stiffness of the flexible carrier can be manifold increased by the folding. With the same arrangements and techniques as can be found in structures made by origami (Japanese paper folding) various geometrical shapes can be achieved.

In certain applications, the relative positioning of different microsystems components are more important than the exact positioning at the carrying structure, i.e. the main structural member. In such cases, adjustments according to the above described principles could be used to achieve the correct relative positions. In the embodiment illustrated in FIG. 1c, the monolithic piezoelectric drive units has to be well aligned, not with respect of the surrounding main structural member, but mainly with the shaft clamped between the three drive units. By allowing for adjustable structures in the flexible printed circuit board, such adjustments are easily performed, something that is more or less impossible if a rigid main structural member would be used.

In some embodiments, resonant features may be used in the electromecanical microsystem, such as resonant micromotors. The resonance frequency is in such cases directly connected to the structural resilience of some or many of the components in the system. The resilience of the flexible printed circuit board can here be used to alter the resonance frequency either at the design stage or at subsequent stages. Changes of the structural geometry by techniques such as folding, locking or releasing of various members are some techniques to adjust the structural resilience. The use of non-linear spring structures is yet another solution that is advantageous due to its simplicity.

Figure 8:
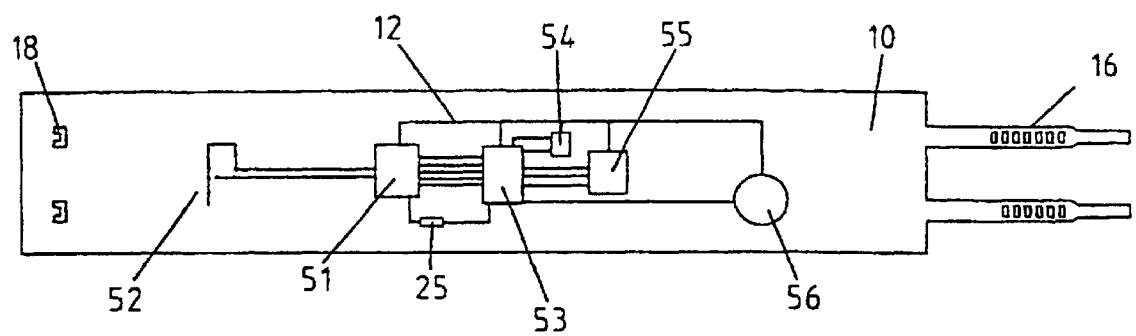
FIG. 8 is a schematic view of a microsystem according to the present invention.

FIG. 8 schematically illustrates another embodiment of the present invention. Here the microsystem is a medical bracelet with all components necessary for monitoring of medical status, e.g. blood pressure, blood oxygen level, pulse etc. A flexible printed circuit board 10 of polyimide is provided with geometrical structures, similar to the ones shown in FIGS. 1a–c, comprising two strips 16 with rectangular holes and two U-formed slits 18. The strips 16 and slits 18 can be mechanically connected, and applied around the wrist of a human being. A sensor 54 reads different medical status variables and sends electrical signals to a micro controller 53. The variables are collected and preevaluated and the results are forwarded to a microwave transducer 51 for transmitting signals to an external control system by means of a micowave antenna 52. A battery 56 is powering the microsystem components. Also an actuator 55 is available, for stimulation of blood flow, drug delivery etc. All components are carried by the flexible printed circuit board 10, and the sensor 54 and actuator 55 are pressed against the patients arm when operable. Furthermore, since polyimide is a biocompatible material, the device is lenient to the skin.

As is understood from the above embodiments of the present invention, the general methods disclosed are applicable to Microsystems of very different types and application areas. The use of the flexible main structural member is, however, advantageous in many applications, and so is the simple and cheap assembling method.

Figure 9:
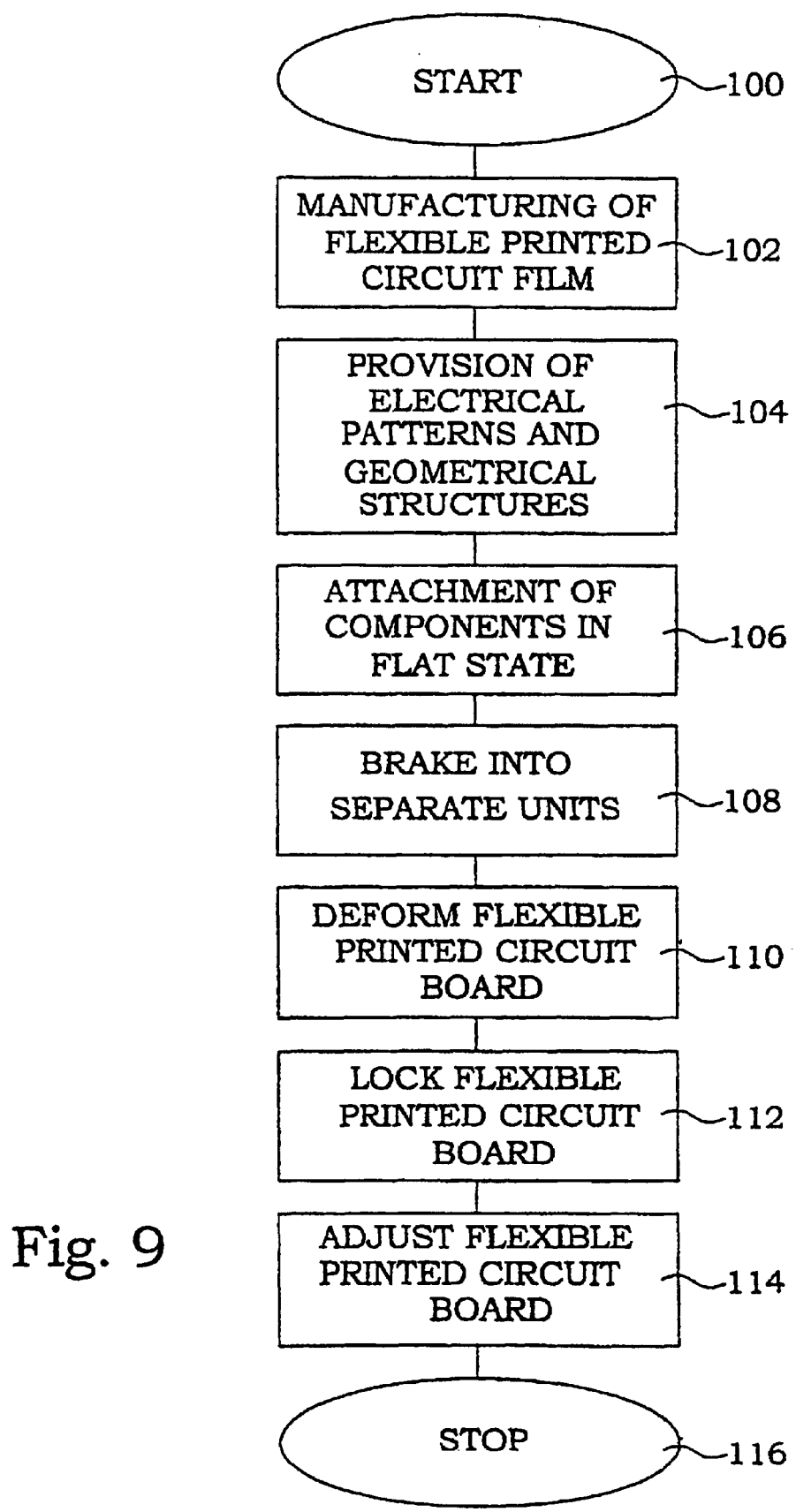
FIG. 9 is a flow diagram illustrating a method for assembling microsystems according to the present invention.

FIG. 9 shows a flow diagram, showing the main steps in a preferred assembling process according to the present invention. The process starts in step 100. In step 102 a large area flexible printed circuit board film is provided by conventional methods. It is an advantage, for mass production, if several identical units may be assembled in batches. Electrical patterns and geometrical structures are provided in step 104. These processes also follows standard procedures known by anyone skilled in the art. In step 106, the mounting of components onto the flexible printed circuit board takes place. This is preferably performed in a substantially flat manner, possibly in a electronic board surface mounting apparatus of known design and operation. The larger area flexible printed circuit board film is broken into separate boards in step 108. Each unit is then provided with the necessary components mounted at the surface thereof. In step 110, the flexible printed circuit board is given its final shape by a deformation step, where the flexible printed circuit board is elastically and maybe also plastically deformed to accomplish a final structurally bearing shape. Geometrical structures providing locking means are in step 112 used for maintaining the deformation. In step 114, the locking is adjusted to achieve suitable positioning, forces and other properties of the microsystem. The process is finally ended at step 116.

Even if the mounting of the components preferably is performed at a substantially flat flexible printed circuit board, there might, be occasions where slightly convex or concave structures are to prefer. Slightly concave or convex flexible printed circuit boards may be necessary in order to achieve smoothely rounded off final structures after folding or bending procedures.

It will be understood by those skilled in the art that various modifications and changes may be made to the present invention without departure from the scope thereof, which is defined by the appended claims.

What is claimed is:

1. A transducer microsystem, being defined as a transducer system in which the size of any active transducer components is in the order of centimeters or less, said transducer microsystem comprising:
    a main structural member, constituting a dominating part of a supporting framework of entire said transducer microsystem;
    said main structural member being a flexible printed circuit board; and
    a number of electromechanical components of an electromechanical transducer, physically attached to said main structural member,
    said flexible printed circuit board comprising electrical connections to said electromechanical components of said electromechanical transducer.

2. The transducer microsystem according to claim 1, wherein said electromechanical transducer operates by at least one physical effect selected from the list consisting of a piezoelectric, an electrostrictive, and a shape memory.

3. The transducer microsystem according to claim 1, wherein said flexible printed circuit board (10) has an elastic deformation, and said flexible printed circuit board (10) forms a general support for internal (30, 32) and external forces.

4. The transducer microsystem according to claim 1, wherein said flexible printed circuit board (10) is elastically deformed to apply an elastic contact force (30, 32) to at least one of said components (22) of said electromechanical transducer; forming a mechanical contact.

5. The transducer microsystem according to claim 1, further comprising electrical components (24) or optical components attached to said flexible printed circuit board (10).

6. The transducer microsystem according to claim 1, wherein said flexible printed circuit board (10) constitutes a casing of said transducer microsystem.

7. The transducer microsystem according to claim 1, wherein said flexible printed circuit board (10) comprises a polyimide material.

8. The transducer microsystem according to claim 1, wherein said flexible printed circuit board (10) is provided with geometrical structures (16, 18, 20; 32, 33, 34; 40, 42; 44, 46, 48) which are engagable to other ones of said geometrical structures (16, 18, 20; 32, 33, 34; 40, 42; 44, 46, 48) and to other members of said transducer microsystem.

9. The transducer microsystem according to claim 5, wherein said flexible printed circuit board (10) is elastically deformed to apply an elastic contact force (30, 32) to at least one of said electrical or optical components (24), forming an electrical contact.

10. The transducer microsystem according to claim 3, wherein said elastic deformation comprises an elastic compression or tension substantially perpendicular to the surface of said flexible printed circuit board (10).

11. The transducer microsystem according to claim 3, wherein said elastic deformation comprises an elastic deflection of at least a portion (19) of said flexible printed circuit board (10).

12. The transducer microsystem according to claim 8, wherein said geometrical structures (16, 18, 20; 32, 33, 34; 40, 42; 44, 46, 48) comprise holes, slits, pits, ridges, valleys or bumps.

13. The transducer microsystem according to claim 8, wherein said geometrical structures (16, 18, 20; 32, 33, 34; 40, 42; 44, 46, 48) comprise adjustable locking structures.

14. The transducer microsystem according to claim 10, wherein said flexible printed circuit board (10) is arranged between a component (22) of said electromechanical transducer and at least one of a rigid support means (36), an electrical or optical component (24), and another of said components (22) of said electromechanical transducer,
    wherein the intrinsic material elasticity of said flexible printed circuit board (10) provides an elastic contact force.

15. The transducer microsystem according to claim 11, wherein said elastic deflection is a bending or a folding.

16. The transducer microsystem according to claim 11, wherein
    a first component (22) of said electromechanical transducer is positioned in the path of said elastic deflection, and
    the resilience of said deflected flexible printed circuit board portion (19) applies a spring force on said first component (22) of said electromechanical transducer.

17. A microelectromechanical motor, comprising a transducer microsystem, being defined as a transducer system in which the size of any active transducer components is in the order of centimeters or less, said transducer microsystem comprising:

a main structural member, constituting a dominating part of a supporting framework of entire said transducer microsystem;

said main structural member being a flexible printed circuit board; and a number of electromechanical components of electromechanical transducer, physically attached to said main structural member;

said flexible printed circuit board comprising electrical connections to said electromechanical components of said electromechanical transducer.

18. A microelectromechanical motor according to claim 17, wherein said microelectromechanical motor operates according to one of the following motion principles:

inertia based, resonant effect and non-resonant repetition of small steps.

19. A method of assembling a transducer microsystem, whereby transducer microsystem being defined as a transducer system in which the size of any active transducer components is in the order of centimeters or less, said assembling method comprising the steps of:

providing a main structural member, constituting a dominating part of a supporting framework of entire said transducer microsystem;

using a flexible printed circuit board as said main structural member;

physically attaching a number of electromechanical components of an electromechanical transducer to said main structural member; and electrically connecting said electromechanical components of said electromechanical transducer to said flexible printed circuit board.

20. The method of assembling a transducer microsystem according to claim 19, comprising the further step of applying an elastic force to at least one of said components (22) of said electromechanical transducer by reshaping at least a portion of said flexible printed circuit board (10).

21. The method of assembling a transducer microsystem according to claim 19, comprising the further step of attaching electrical components (24) or optical components to said flexible printed circuit board (10).

22. The method of assembling a transducer microsystem according to claim 19, wherein at least the major part of any steps of attaching components (22, 24, 26) to said flexible printed circuit are performed on a substantially flat flexible printed circuit board (10).

23. The method of assembling a transducer microsystem according to claim 19, comprising the further step of providing said flexible printed circuit board (10) with geometrical structures (16, 18, 20; 32, 33, 34; 40, 42; 44, 46, 48) engagable to other ones of said geometrical structures (16, 18, 20; 32, 33, 34; 40, 42; 44, 46, 48) and to other members of said transducer microsystem.

24. The method of assembling a transducer microsystem according to claim 23, comprising the further step of locking said flexible printed circuit board (10) by said geometrical structures (16, 18, 20; 32, 33, 34; 40, 42; 44, 46, 48) to apply an elastic force to at least a first of said components (22) of said electromechanical transducer.

25. The method of assembling a transducer microsystem according to claim 20, wherein said step of reshaping comprises at least one of the following steps:

elastically folding said flexible printed circuit (10);

elastically bending said flexible printed circuit (10); and elastically tensing or compressing said flexible printed circuit (10) substantially perpendicular to its surface.

26. The method of assembling a transducer microsystem according to claim 24, wherein adjusting said flexible printed circuit board by locking to apply an elastic force compensates for thermal, dimensional variations, adjusts mechanical resonances of said first component (22) of said electromechanical transducer, or adjusts the position of said first component (22) of said electromechanical transducer.

27. The method of assembling a transducer microsystem according to claim 25, wherein the step of positioning a component (22) of said electromechanical transducer in the path of said elastic reshaping allows the resilience of said reshaped flexible printed circuit board portion (19) to apply a spring force on said electromechanical transducer component (22).

* * * * *